US006185128B1

(12) United States Patent
Chen et al.

(10) Patent No.: US 6,185,128 B1
(45) Date of Patent: Feb. 6, 2001

(54) REFERENCE CELL FOUR-WAY SWITCH FOR A SIMULTANEOUS OPERATION FLASH MEMORY DEVICE

(75) Inventors: Tien-Min Chen, San Jose; Kazuhiro Kurihara, Sunnyvale; Takao Akaogi, Cupertino, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/421,984

(22) Filed: Oct. 19, 1999

(51) Int. Cl.[7] .................................................. G11C 16/04

(52) U.S. Cl. ................................. 365/185.11; 365/185.33

(58) Field of Search ........................... 365/185.11, 185.2, 365/185.21, 185.22, 185.33

(56) References Cited

U.S. PATENT DOCUMENTS

| 5,263,000 | 11/1993 | Buskirk et al. ................... 365/226 |
| 5,291,446 | 3/1994 | Buskirk et al. ................ 365/189.09 |
| 5,612,921 | 3/1997 | Chang et al. ..................... 365/226 |
| 5,675,537 | * 10/1997 | Bill et al. ..................... 365/185.22 |
| 5,708,387 | 1/1998 | Cleveland et al. .................. 327/536 |
| 5,847,998 | 12/1998 | Buskirk .......................... 365/185.33 |
| 5,867,430 | 2/1999 | Chen et al. ..................... 365/189.04 |
| 6,084,797 | * 7/2000 | Maloberti et al. .............. 365/185.22 |

OTHER PUBLICATIONS

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.
AMD, Technology Background brochure, "3.0 Volt–only Page Mode Flash Memory Technology."
AMD, Technology Background brochure, "3.0 Volt–only Burst Mode Flash Memory Technology."
AMD, Technology Background brochure, "1.8 Volt–only Flash Memory Technology."
AMD, Technology Background brochure, "AMD DL 160 and DL320 Series Flash: New Densities, New Features."
Intel Corporation, "Common Flash Memory Interface Specification", Release 1.1, May 30, 1997.
AMD, "Common Flash Memory Interface Publication 100—Vendor & Device ID Code Assignments", Jul. 25, 1996, vol. 96.1.
AMD "Am29DL 162C/AM29DL 163C 16 Megabit (2 M x 8–Bit/1 M x 16–Bit) CMOS 3.0 Volt–only, Simultaneous Operation Flash Memory", Publication 21533, Rev: C Amendment/+2, Jul. 14, 1999.
Intel Corporation, "1.8 Volt Intel® Dual–Plane Flash Memory 28F320D18 (x16)", Product Review Datasheet, Order Number: 290672–002, Oct. 1999.
Macronix International Co., Ltd. "MXIC Advance Information MX29VW160T/B—16M–BIT [2M x 8–BIT/1M x 16 BIT] Simultaneous Read/Write Single 2.5V Operation Flash Memory", P/N:PM0567, Rev. 0.8, May 17, 1999.

(List continued on next page.)

Primary Examiner—Trong Phan
(74) Attorney, Agent, or Firm—Brinks Hofer Gilson & Lione

(57) ABSTRACT

A flash memory system capable of simultaneous operation comprises upper and lower memory banks of flash memory cells, reference cells generating reference signals, a switch coupled to the reference cells and upper and lower sense amplifiers coupled to the switch and to the upper and lower memory bank, respectively. The switch steers the appropriate reference signal to the appropriate upper sense amplifier along one upper signal line and steers the appropriate reference signal to the appropriate lower sense amplifier along a lower signal line. The upper and lower sense amplifiers generate comparison signals in response to reference signals and data stored in the upper and lower memory bank, respectively.

6 Claims, 5 Drawing Sheets

OTHER PUBLICATIONS

ATMEL Corporation, "ATMEL® 16–megabit (1M x 16/2Mx8) 3–volt Only Flash Memory", Rev. 0925H–Aug./99.

STMicroelectronics, "M59DR032A, M59DR032B, 32 Mbit (2Mb x 16, Dual Bank, Page) Low Voltage Flash Memory", preliminary data, Oct. 1999, pp. 1–38.

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

AMD, "Simultaneous Read/Write Flash FAQ," obtained off the internet.

"AMD News Release #9879", obtained at the internet address http://www.amd.com/news/prodpr/9879.html.

"Intel® 1.8 Volt Dual–Plane 32–Mbit Flash Memory (D18)", obtained at the internet address http://www.intel.com/design/ flcomp/prodbref/298131.htm, Nov. 18, 1999.

U.S. Patent Application, Serial No. 09/159, 029, filed Sep. 23, 1998.

U.S. Patent Application, Serial No. 09/159,142, filed Sep. 23, 1998.

U.S. Patent Application, Serial No. 09/159, 489, filed Sep. 23, 1998.

* cited by examiner

REFERENCE CELL FOUR-WAY SWITCH FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices is integrated-circuit-based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to a flash memory system capable of simultaneous operation comprising upper and lower memory banks of flash memory cells, reference cells generating reference signals, a switch coupled to the reference cells and upper and lower sense amplifiers coupled to the switch and to the upper and lower memory bank, respectively. The switch steers the appropriate reference signal to the appropriate upper sense amplifier along an upper signal line and steers the appropriate reference signal to the appropriate lower sense amplifier along a lower signal line. The upper and lower sense amplifiers generate comparison signals in response to reference signals and data stored in the upper and lower memory bank, respectively. An objective of the preferred embodiment is to reduce the number of system components by sharing the reference cells between the upper and lower memory banks, thereby reducing system cost and size.

DETAILED DESCRIPTION OF THE PRESENTLY PREFERRED EMBODIMENTS

Herein, the phrase "coupled with" is defined to mean directly connected to or indirectly connected with through one or more intermediate components.

Figure 1:
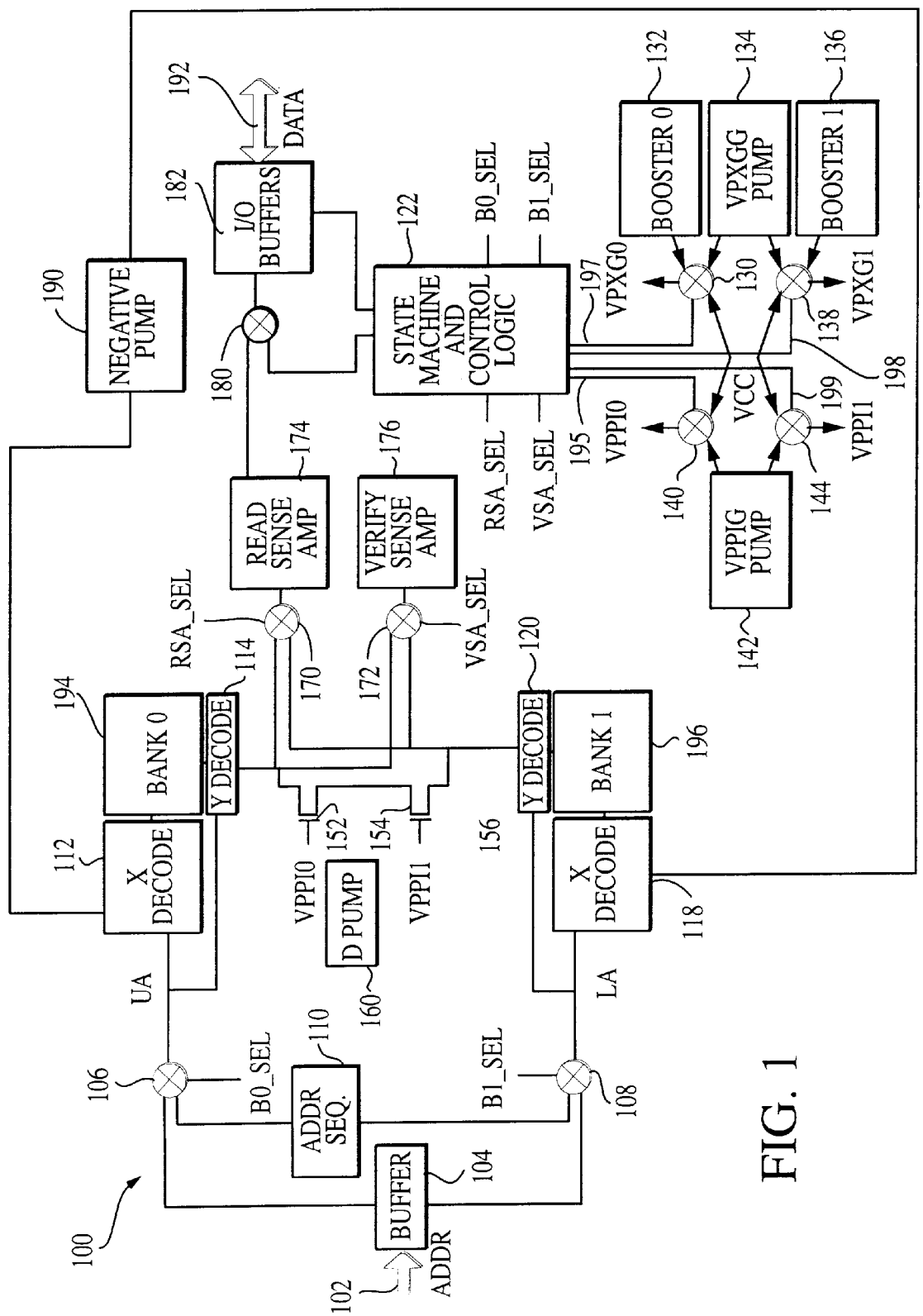
FIG. 1 depicts a block diagram of a flash memory chip according to the present invention that is capable of simultaneous reading and writing.

Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL 162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL 162C/Am29L 163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, D pump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by sectors and then by words and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXGO. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG 1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased.

Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,029, "METHOD OF MAKING FLEXIBLY PARTITIONED METAL LINE SEGMENTS FOR A SIMULTANEOUS OPERATION FLASH MEMORY WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

In the flash memory device 100, implementation of simultaneous operation is largely achieved by the dual bank architecture of the chip as described above. While this architecture permits simultaneous reading and writing, the dual bank architecture adds complexities of its own to the design of the memory device 100. In particular, the implementation of two separate and independently accessible memory arrays in some cases requires additional logic and other support circuitry which would ordinarily not be required on a device with a single memory array. On the one hand, the dual bank architecture is generally implemented using largely separate, and thus additional, logic and other support circuitry for each bank 194, 196. On the other hand, some of the logic and support circuitry is shared by both banks 194 and 196, and that sharing requires additional logic to achieve coordination of the sharing effort. It will be appreciated that the division of logic and other support circuitry, between that which is shared between the banks 194, 196 and that which is bank specific, is implementation dependent and may change.

As described above, each bank of the exemplary flash memory chip has support circuitry comprising its own set of read sense amplifiers which are used to sense and amplify the selected output data from the memory bank during a read operation. As described above, each bank of the exemplary flash memory chip also has its own set of verify sense amplifiers which are used to sense and amplify the selected output data from the memory bank during a verify operation in connection with a write operation. Each read sense amplifier and each verify sense amplifier comparison in turn has support circuitry. In particular, both kinds of sense amplifiers operate on a comparative method, comparing the signals received from a memory bank to a reference signal received from a reference cell. Naturally, this comparison can be performed by sense amplifiers operating in a differential mode responding to the difference between the memory bank signals and the reference cell signals, or the comparison can be performed in a variety of other ways known to those skilled in the art.

Figure 2:
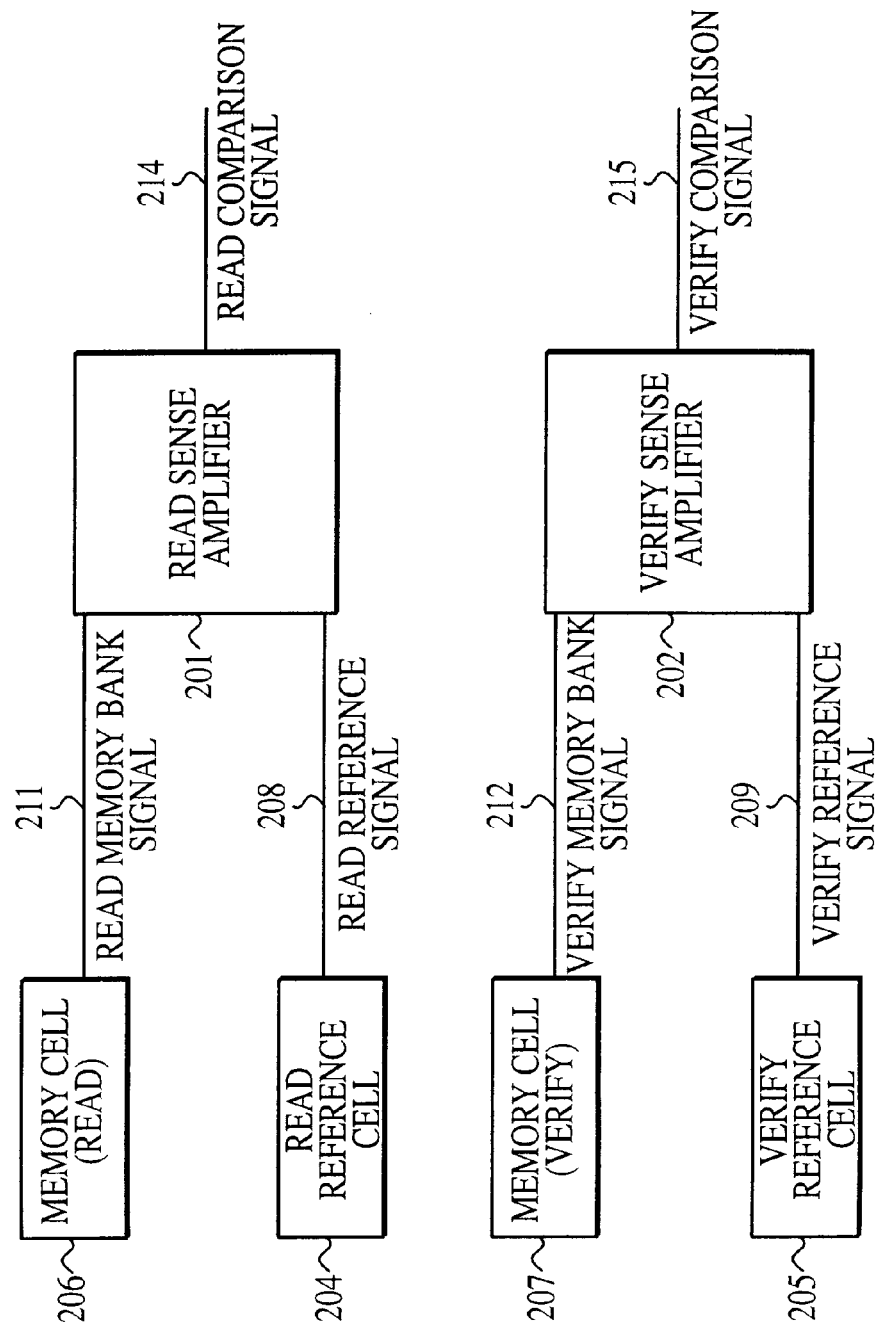
FIG. 2 depicts a block diagram of the comparison technique for sense amplifiers.

FIG. 2 depicts a block diagram of the comparison technique for both a representative read sense amplifier 201 and verify sense amplifier 202 showing the read reference cell 204 and verify reference cell 205 as well as a representative memory cell from one of the two banks being read 206 and being verified 207, for the read sense amplifier and verify sense amplifier, respectively. FIG. 2 also depicts the read reference signal 208 and the verify reference signal 209, and the read memory bank signal 211 and the verify memory bank signal 212 for the read sense amplifier and verify sense amplifier, respectively. Finally, FIG. 2 depicts the read comparison signal 214 and verify comparison signal 215 generated by the read sense amplifier and verify sense amplifier, respectively.

Figure 3:
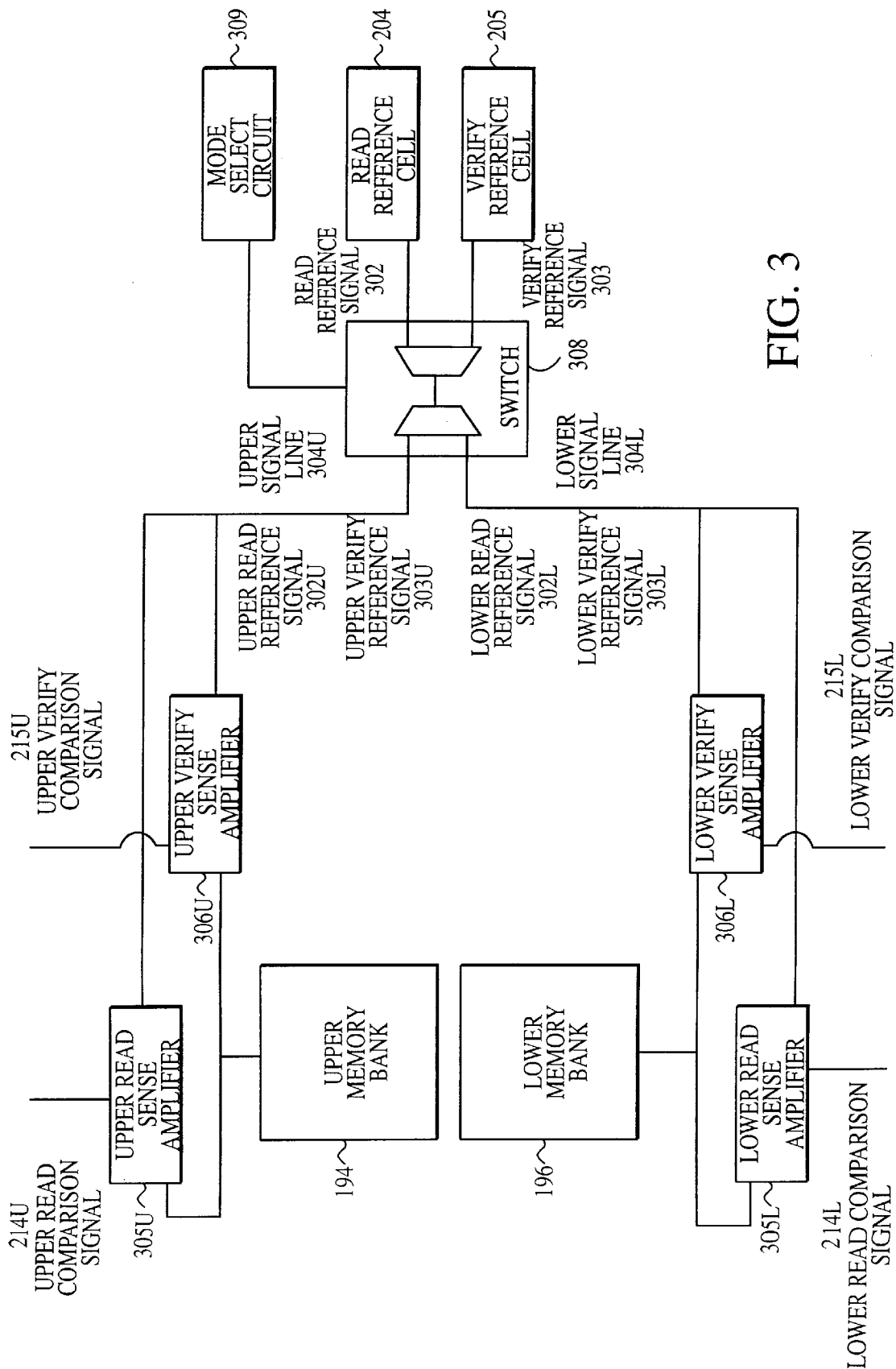
FIG. 3 depicts a block diagram of a dual bank memory device with a four-way switch.

FIG. 3 depicts a block diagram of one of the embodiments of the present invention. In this embodiment each of the upper and lower memory banks 194, 196 have their own read sense amplifiers 305U and 305L and their own verify sense amplifiers, 306U and 306L, respectively, and each bank is coupled to only its own sense amplifiers. In this embodiment, the use of the read reference cell 204 and verify reference cell 205 are shared by the two banks 194, 196. It will be appreciated by those skilled in the art that more than one verify reference cell may be employed. For example, two verify reference cells can be used to verify proper programming and erasure, two inherently different physical processes as described above.

The read reference signal 302 and verify reference signal 303 are generated at the output of the read reference cell and verify reference cell, respectively. It will be appreciated by those skilled in the art that the verify reference signal 303 may come in different forms depending on whether a programming or erasure operation is being verified. The upper read reference signal and the upper verify reference signal 302U, 303U transmitted to the upper read sense amplifier 305U and upper verify sense amplifier 306U share a common upper signal line 304U, and similarly, the lower read reference signal and lower verify reference signal 302L, 303L share a common lower signal line 304L to the lower read sense amplifier 305L and verify sense amplifier 306L.

Accordingly, a switch 308 that performs both a loose form of multiplexing and a loose form of demultiplexing function can be used to choose between the read reference signal 302 and the verify 303 reference signal at the switch's input channel lines for processing and further transmittal and to choose between the upper signal line and the lower signal line at its upper and lower output channel lines, respectively, for the path of that further transmission. This choosing can occur simultaneously. For example, an upper read reference signal can travel along the upper signal line simultaneously with a lower verify reference signal along the lower signal line. Again, as an example, an upper verify reference signal can travel along the upper signal line simultaneously with the traveling of a lower read reference signal along the lower signal line.

The outputs of the read sense amplifier and verify sense amplifier are depicted as upper and lower read comparison signals 214U, 214L and upper and lower verify comparison signals 215U, 215L, for the upper and lower sense amplifiers, respectively. A mode select circuit 309 controls the action of the switch to cause the appropriate choices at the switch's input channel lines and output channel lines.

Figure 4:
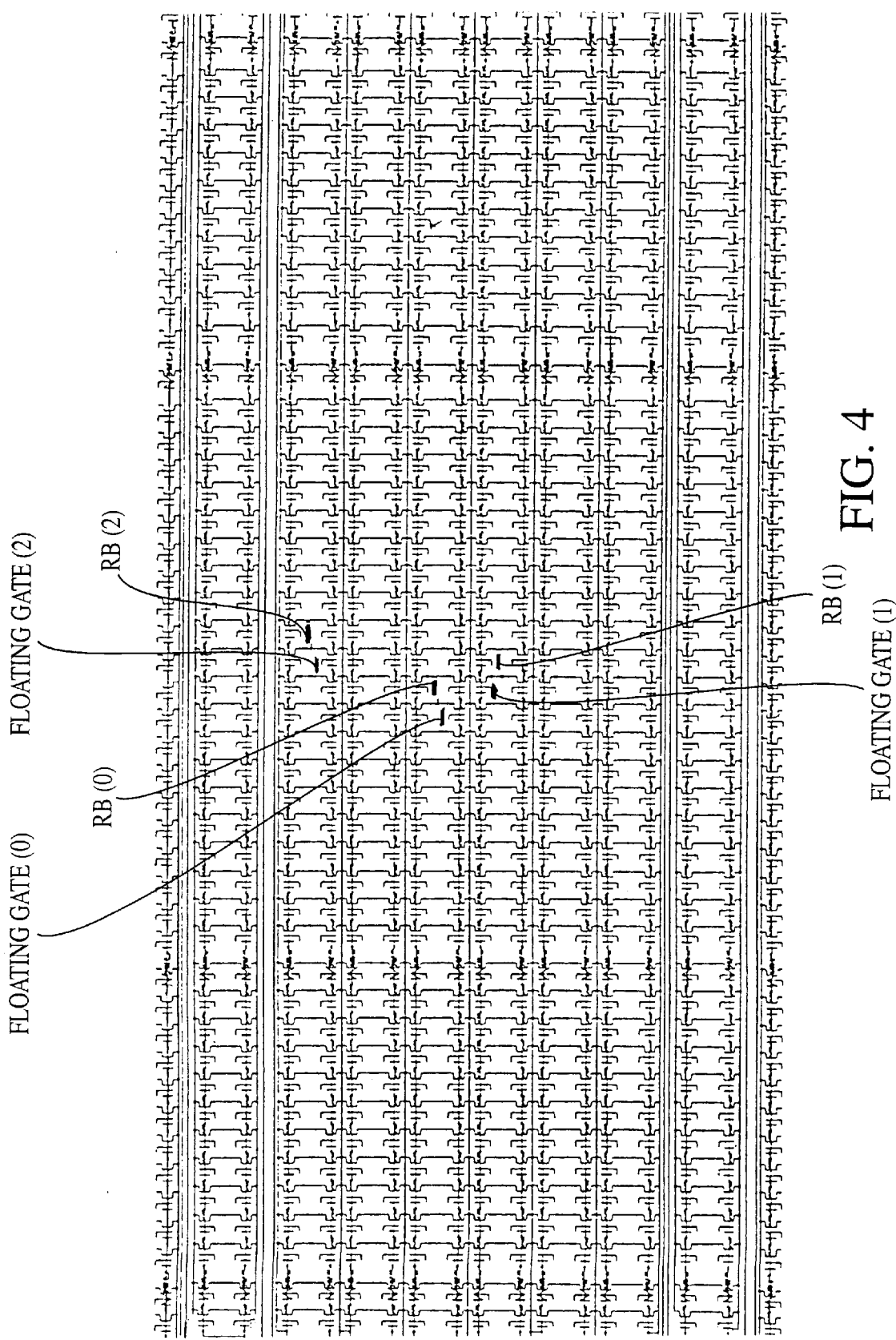
FIG. 4 depicts an array of reference cells.

FIG. 4 is a circuit level diagram of an embodiment of the present invention and depicts an array of cells comprising flash memory cells like those in banks 194, 196. Shown in this array are three reference cells employed in the present embodiment. The three used are the read reference cell 401R, the program verify read cell 401PV and the erase verify reference cell 401EV. Two verify reference cells are used to verify proper programming and erasure for reasons described above. The signals at the drains of the transistors in those three cells are labeled RB(3), RB(2) and RB(1), respectively. A very large number of dummy cells surround the reference cells to reduce edge effects on the reference cell bits and provide RC delay on the reference cell wordline. The amount of charge stored on the floating gates of each of the three reference cells will ultimately be determined by the particular application as will be appreciated by those skilled in the art. In turn, the stored charge on the three floating gates will determine the drain signals RB(3), RB(2) and RB(1).

Figure 5:
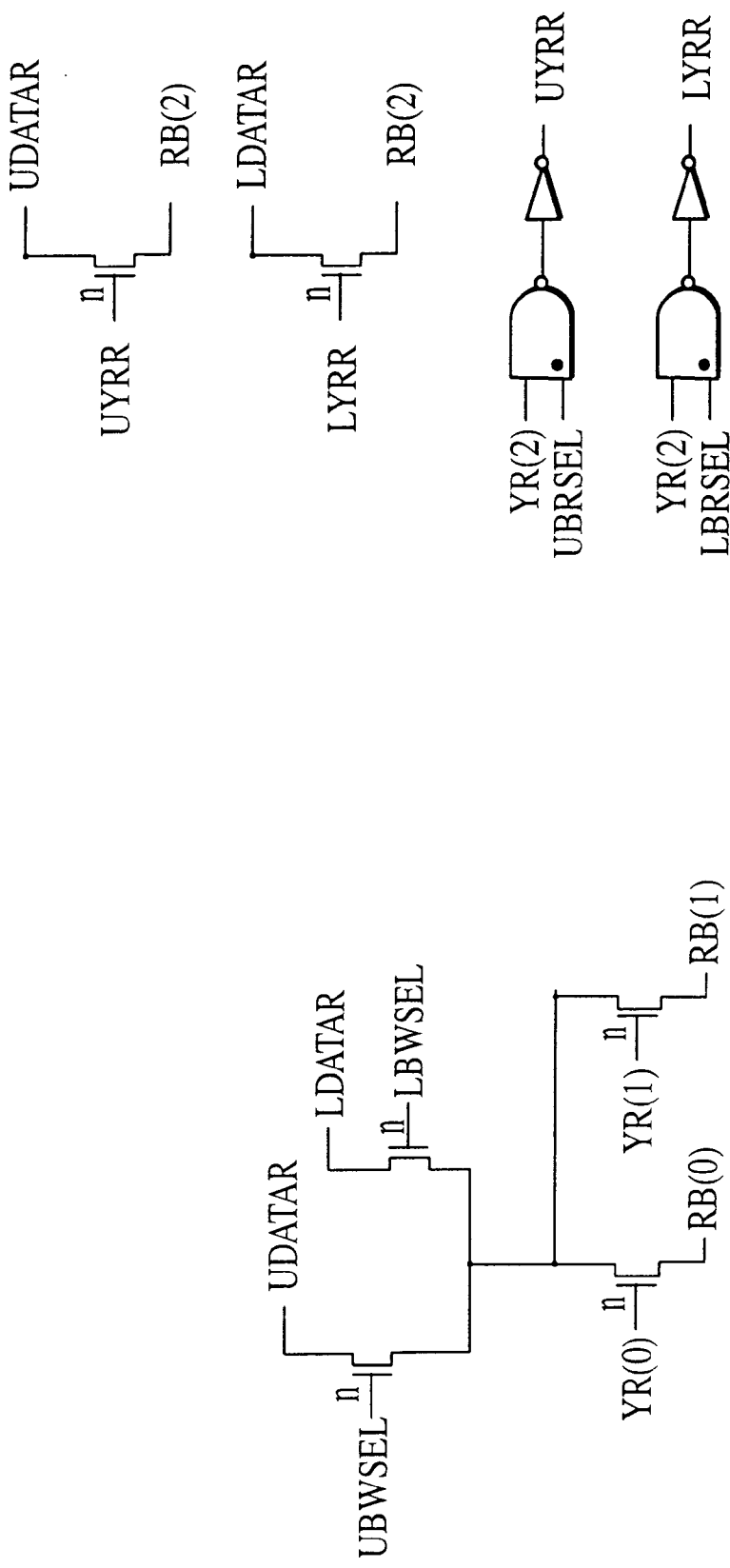
FIG. 5 depicts a circuit diagram of a four-way switch.

FIG. 5 is a circuit level diagram of an embodiment of a switch that can be employed in the present invention. This switch is controlled by the mode select reference cell signals YR(0), YR(1), YR(2) and the mode select upper/lower/read/verify signals UBRSEL, UBWSEL, LBRSEL and LBWSEL generated within mode select circuitry not depicted explicitly in FIG. 1, but which represents combinational logic known to those skilled in the art. The symbol "W" in the labels represents the operation of verifying. The symbol "DC" means "Don't Care" and either a logical 1 or 0 is permissible. Table 1 below depicts the output of the mode select circuitry depending upon whether the upper or lower bank is being acted on, whether that action is read or verify, and, if verify action, whether the verify action relates to program or erase:

TABLE I

|  | YR (0) | YR (1) | YR (2) | UBRSEL | LBRSEL | UBWSEL | LBWSEL |
|---|---|---|---|---|---|---|---|
| Upper Bank Read | DC | DC | 1 | 1 | 0 | 0 | DC |
| Upper Bank Verify - Program | 0 | 1 | 1 | 0 | DC | 1 | 0 |
| Upper Bank Verify - Erase | 1 | 0 | 1 | 0 | DC | 1 | 0 |
| Upper Bank Read | DC | DC | 1 | 0 | 1 | DC | 0 |
| Lower Bank Verify - Program | 0 | 1 | 1 | DC | 0 | 0 | 1 |
| Lower Bank Verify - Erase | 1 | 0 | 1 | DC | 0 | 0 | 1 |

The signal "mv" shown on certain of the transistor signifies that the oxide of the transistor can support a voltage of up to about 12 volts applied between gate and source without damage or significant leakage.

The relationship between Table 1 and FIG. 5 on the one hand, and FIGS. 3 and 4 on the other hand, is as follows.

First, consider Table 1. The first row of Table 1 corresponds to switch 308 of FIG. 3 under the control of mode select circuit 309 choosing the read reference signal and choosing the upper signal line. The second and third rows correspond to switch 308 choosing the verify reference signal from one of two verify reference cells (depending on whether programming or erasure is being verified) and choosing the upper signal line. The fourth, fifth and sixth rows function like the first, second and third rows, but with the substitution of "lower" for "upper".

Next, consider FIG. 5. The drain signals RB(3), RB(2) and RB(1) of FIG. 4 are inputs to the circuitry of FIG. 5. In addition, UDATR depicted in FIG. 5 is the signal at the upper output channel of switch 308 of FIG. 3, which will be either the upper read reference signal 302U or upper verify reference signal 303U of FIG. 3, depending on whether UDATR of FIG. 5 is determined by UBRSEL or UBWSEL, respectively, being a "1" in Table 1. LDATR depicted in FIG. 5 has a similar correspondence to FIG. 3, with the substitution of "lower" for "upper" in the explanation of UDATR.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

What is claimed is:

1. A flash memory system capable of simultaneous operation comprising:
   an upper memory bank of flash memory cells storing upper data;
   a lower memory bank of flash memory cells storing lower data;
   one or more reference cells generating one or more corresponding reference signals;
   a switch coupled to the one or more reference cells, the switch generating one or more upper reference signals in response to the one or more corresponding reference signals and generating one or more lower reference signals in response to the one or more corresponding reference signals;
   one or more upper sense amplifiers coupled to the upper memory bank and to the switch, each of the one or more upper sense amplifiers generating an upper comparison signal in response to one of the one or more upper reference signals and in response to the upper data; and
   one or more lower sense amplifiers coupled to the lower memory bank and to the switch, each of the one or more lower sense amplifiers generating a lower comparison signal in response to one of the one or more lower reference signals and in response to the lower data.

2. A flash memory system capable of simultaneous operation comprising:
   a read reference cell generating a read reference signal;
   one or more verify reference cells generating one or more corresponding verify reference signals;
   a mode select circuit generating selectively a read mode signal representing a read operation and a verify mode signal representing a verify operation, the mode select circuit further generating selectively an upper bank mode signal and a lower bank mode signal;
   a switch having a plurality of channel inputs, a control input, an upper channel output and a lower channel output;
   the switch being coupled at its channel inputs to the read reference cell and the one or more verify reference cells and coupled at its control input to the mode select circuit;
   the switch selectively generating at the upper channel output an upper read reference signal in response to the read mode signal, the upper bank mode signal and the read reference signal and an upper verify reference signal in response to the verify mode signal, the upper bank mode signal and the one or more verify reference signals;
   the switch selectively generating at its lower channel output a lower read reference signal in response to the read mode signal, the lower bank mode signal and the read reference signal and a lower verify reference signal in response to the verify mode signal, the lower bank mode signal and the one or more verify reference signals.

3. The flash memory system according to claim 2 further comprising:
- an upper memory bank of flash memory cells storing upper data;
- an upper signal line coupled to the upper channel output and transmitting the upper read reference signal;
- an upper read sense amplifier coupled to the upper memory bank and the upper signal line, the upper read sense amplifier generating an upper read comparison signal in response to the upper read reference signal and in response to the upper data.

4. The flash memory system according to claim 3 further comprising:
- a lower memory bank of flash memory cells storing lower data;
- a lower signal line coupled to the lower channel output and transmitting the lower read reference signal;
- a lower read sense amplifier coupled to the lower memory bank and the lower signal line, the lower read sense amplifier generating a lower read comparison signal in response to the lower read reference signal and in response to the lower data.

5. The flash memory system according to claim 4 wherein the upper signal line also transmits the upper verify reference signal; and
- the flash memory system further comprising an upper verify sense amplifier coupled to the upper memory bank and the upper signal line, the upper verify sense amplifier generating an upper verify comparison signal in response to the upper verify reference signal and in response to the upper data.

6. The flash memory system according to claim 5 wherein the lower signal line also transmits the lower verify reference signal; and
- the flash memory system further comprising a lower verify sense amplifier coupled to the lower memory bank and the lower signal line, the lower verify sense amplifier generating a lower verify comparison signal in response to the lower verify reference signal and in response to the lower data.

* * * * *

UNITED STATES PATENT AND TRADEMARK OFFICE
CERTIFICATE OF CORRECTION

PATENT NO. : 6,185,128 B1
DATED : February 6, 2001
INVENTOR(S) : Tien-Min Chen, Kazuhiro Kurihara and Takao Akaogi It is certified that error appears in the above-identified patent and that said Letters Patent is hereby corrected as shown below:

<u>Title page,</u>
Item [73], should read as follows:
[73]   Assignee:   Advanced Micro Devices, Inc.
One AMD Place, Sunnyvale, California 94099-3453
Fujitsu Limited
1-1 Kamikodanaka, 4-Chome, Nakahara-Ku, Kawasaki-Shi
Kanagawa, 211-8588, Japan Signed and Sealed this Twenty-fifth Day of June, 2002

*Attest:*

JAMES E. ROGAN
*Attesting Officer*   *Director of the United States Patent and Trademark Office*